United States Patent [19]

Hess

[11] Patent Number: 4,821,905

[45] Date of Patent: Apr. 18, 1989

[54] PROTECTIVE HOUSING MADE OF A SYNTHETIC MATERIAL TO HOLD MEASURING, CONTROL, MONITORING AND SIMILAR DEVICES IN REPEATED USE UNDER TIGHTLY SEALED CONDITIONS

[76] Inventor: Joachim Hess, D-8070 Schroeplerstrasse 35, Ingolstadt, Fed. Rep. of Germany

[21] Appl. No.: 152,049

[22] Filed: Feb. 4, 1988

[30] Foreign Application Priority Data

Feb. 10, 1987 [DE] Fed. Rep. of Germany ....... 3704015

[51] Int. Cl.$^4$ .............................................. B65D 6/00
[52] U.S. Cl. .................... 220/4 B; 220/4 E; 206/508
[58] Field of Search ...................... 220/4 B, 4 E, 4 C; 206/509, 505, 508

[56] References Cited

U.S. PATENT DOCUMENTS

| | | | |
|---|---|---|---|
| 3,018,003 | 1/1962 | Lockwood | 220/4 E |
| 3,261,396 | 7/1966 | Trunk | 165/80 |
| 3,313,340 | 4/1967 | Dubin | 165/47 |
| 3,333,760 | 8/1967 | Bridenstine | 220/4 B |
| 3,451,580 | 6/1969 | Husby | 220/4 B |
| 3,670,872 | 6/1972 | Rock et al. | 220/4 B |
| 3,693,410 | 9/1972 | Robrecht et al. | 220/4 E |
| 3,833,837 | 9/1974 | West | 165/80 |
| 4,027,206 | 5/1977 | Lee | 165/80 |
| 4,512,474 | 4/1985 | Harding | 220/4 E |
| 4,546,874 | 10/1985 | Kirchhan | 220/4 B |
| 4,757,920 | 7/1988 | Harootian, Jr. et al. | 220/4 B |

FOREIGN PATENT DOCUMENTS

| | | |
|---|---|---|
| 1764486 | 5/1973 | Fed. Rep. of Germany . |
| 2446235 | 2/1976 | Fed. Rep. of Germany . |
| 3415554 | 7/1986 | Fed. Rep. of Germany . |
| 3500976 | 7/1986 | Fed. Rep. of Germany . |

Primary Examiner—Willis Little
Attorney, Agent, or Firm—Cort Flint

[57] ABSTRACT

The instant invention relates to a protective housing made of a synthetic material to hold measuring, control, monitoring and similar devices in repeated use under tightly sealed conditions, consisting of two housing elements (19, 20) in the form of a roof or of a three-sided prism, each with an all-around juxtaposition rim (6). According to the invention, the central roof surfaces (2, 3) in each of two band-like wall segments (12, 13) are bent towards the juxtaposition rim (6) and stand, at a slightly conical pitch, nearly perpendicularly on the juxtaposition surface constituted by the juxtaposition rim (6). Wall reinforcement elements (7, 9) or blocks of material, beginning at the juxtaposition rim 6 are molded on to the band-like wall segments (12, 13) and at the same all-around height also on the lateral surfaces (4, 5) to serve as stacking support points and to receive hardware. The lateral surfaces (4, 5) are inclined towards each other at a slightly conical pitch. A protective housing with universal applications and with individual elements that are easy to stack is obtained by means of the above-mentioned characteristics.

19 Claims, 5 Drawing Sheets

PROTECTIVE HOUSING MADE OF A SYNTHETIC MATERIAL TO HOLD MEASURING, CONTROL, MONITORING AND SIMILAR DEVICES IN REPEATED USE UNDER TIGHTLY SEALED CONDITIONS

BACKGROUND OF THE INVENTION

The instant invention relates to a protective housing made of a synthetic material to hold measuring, control, monitoring and similar devices in repeated use under tightly sealed conditions.

In chemical and refining plants, field instruments such as measuring transducers are generally built into protective housings made of a synthetic material to protect these instruments from climatic conditions and aggressive substances and thus to ensure their proper operation and long tool life.

Such protective housings are known in a great number of designs. Current configurations consist mostly of a box-type element which is open on one side and of a cover element which overlaps and tightly closes the first element in the manner of a hat in repeated use with the intercalation of seals.

In another design (AGCO Company, The Netherlands, Instrument Protection System) a box-type protective housing is divided into two housing elements along the diagonals of the lateral surfaces so that either housing element is in the form of a roof or three-edged prism with an open base surface with an all-around juxtaposition rim.

The two housing elements are, however, of somewhat different configurations, so that the expense for the manufacture of two different molds must be incurred, as well as the expense for storing, shipping, etc., two different housing elements.

Hardware such as hinges or quick-release locks is apparently attached directly on the housing wall without any further supports and wall reinforcements, so that their strength may not be sufficient under conditions of strenuous use and rough handling in the field.

Space-saving stacking of individual housing elements into each other does not appear to be possible as no inclination of lateral surfaces can be discerned. Stacks of some height would in any case be out of the question because of lacking stack supports since the weight would be transferred to an excessive extent upon the rather thin walls of the housing elements at the bottom of the stack. Since the housing elements do not have a symmetric roof shape as a rule, the center of gravity would furthermore shift to the outside of the support surface so that the stack could no longer stand on its own. Stacking, storing and packaging is therefore expensive and difficult for the manufacturer as well as for the buyer.

The tightness and stability of the closed housing could also be improved to advantage.

Accordingly, an object of the instant invention is to create a protective housing that can be produced simply and inexpensively, and can be stacked easily and put to general use.

SUMMARY OF THE INVENTION

The object is achieved according to the invention by providing central roof surfaces bent in a band-like wall segment towards the juxtaposition surface. Each band-like wall segment stands nearly perpendicularly on the juxtaposition surface with a slight conical inclination towards the central surfaces. At the band-like wall segments and/or at the same height all around, also on the lateral surfaces, a reinforcement of the wall or blocks of material begins at the juxtaposition rim and is incorporated to form stacking support points and to accept hardware. The lateral surfaces are inclined towards each other at a slightly conical pitch. This has the advantage that the housing elements can be stacked into each other in a space-saving manner. The stack may grow vertically upwards and does not tip over. The occurring load is transmitted downward via the wall reinforcements to the support surface of the stack so that the thin-walled and delicate wall surfaces are not exposed to stresses. The conical pitches of the lateral walls and of the band-like wall segments on the one hand ensure easy removal from the mold, as the protective housing made of synthetic material is preferably hot-pressed or hot-extruded in molds. On the other hand, the slanted position of the walls makes it possible to stack the housing elements into each other.

The wall reinforcements or blocks of material also serve several purposes. First of all they serve as load-diverting stacking support points as described above. Furthermore they result in overall ribbing and reinforcement of the housing. But they are especially used to attach the hardware which can be mounted on them securely and firmly. The adjoining band-like wall segments of two housing elements approximately constitute a plane so that hinges or quick-release locks for example, can be attached simply and easily, without having to be led around corners or edges. The band-like wall segment and the wall reinforcements incorporated into them are therefore preferably sized to the length of standard hardware brackets so that these can be attached securely. On the complete housing the bent band-like wall segments produce cut-off edges at the front of the lower side and at the top of the rear side. The inner housing space lost because of this is minimal when compared to the housing sizes in general use and is therefore of no importance. In any case, the areas near the edges are almost never filled by instruments or accessories. The thickness of the wall reinforcements is to be determined preferably in function of the width of the incorporated juxtaposition rim so that an even outer contour is provided for the attachment of hardware with the juxtaposition rim not extending above it as it would otherwise have to be bridged by the hardware.

The two housing elements are identical. This allows for efficient production with only one mold and for economic storage, packing, shipping, etc. It is advantageous to make the wall reinforcements lower than the height of the band-like wall segment. In this way the protruding portion of the band-like wall segment acts as a lateral guide in stacking. The hardware for the protective housing can consist of hinges or quick-release locks. Universal applications result from the fact that neither the type of hardware nor its method of attachment need be taken into consideration in manufacturing the housing elements. The hardware can thus be attached at a later point in time, when an actual order has been received by the manufacturer, or only at the user's plant, depending on existing conditions.

In an embodiment with hinges, these can be attached on top, on the bottom or laterally, so that the forward element of the housing can be opened in the most suitable manner. If opening is to be effected in an upward direction it is recommended that a holding device e.g. in form of a known knuckle joint be attached. For a lateral hinge, the forward housing element remains open by itself because of the diagonally extending hinge axis.

If an embodiment with quick-release locks only is selected, the forward housing element can be removed entirely so that the built-in instruments are easily accessible, especially for assembly. A model with hinges can also be delivered with the housing elements separate and the bolts enclosed separately so that the forward housing element can be mounted and the protective housing can be completed after easy assembly.

Of course it is also possible to use only one housing element as a protective covering roof. Each wall reinforcement may face a hooking catch for the attachment of a quick-release lock when two identical housing elements are put together.

A positive-locking connection with a groove and an appropriate projection on the opposite side and a groove going all around to receive an elastic sealing band is preferred here. The elastic sealing band is squeezed into both grooves which are preferably on the outside and constitute a ring-shaped cavity, so that the protective housing is completely sealed. The positive-locking connection is preferably on the inside and plays mainly a centering role while improving the stability of the entire housing. Especially the lateral stresses of quick-release locks are absorbed.

To make it possible for two identical housing elements to be used, the border profile must change at the center of the lateral surfaces so that the first groove is located in one zone and the corresponding projection in the other zone. The material reinforcements used as stacking points are preferably provided with a juxtaposition surface taking the groove into account in such an embodiment. A stepped configuration or an appropriate groove indentation is advantageous.

In many applications it is necessary to equip the protective housing with a thermal insulation layer. Thermal insulation foam may be extruded against the sides of the housing for this purpose. The extruded foam can follow the contour of the band-like wall segment on its inside without any loss of space.

It is obvious that a housing with extruded foam or a completed housing with hardware already attached cannot be stacked as mentioned earlier.

However, it is possible to obtain good stackability even with this model. Supports made as male and female elements with juxtaposition surfaces which engage each other when rotated by 180° are provided in this case and thus constitute an antislipping device. Scratching and soiling are also prevented thereby, as the supports act as small feet. Preferably, four supports are attached near the corners of the surfaces. The juxtaposition surfaces may be made in different shapes as desired and only must ensure blockage in the two surface degrees of freedom. Preferably, corner pieces with obliquely standing juxtaposition surfaces are used. This provides the necessary pitch for removal from the mold as well as juxtaposition inclines facilitating simple and easy stacking.

DESCRIPTION OF THE DRAWINGS

The construction designed to carry out the invention will hereinafter be described, together with other features thereof.

The invention will be more readily understood from a reading of the following specification and, by reference to the accompanying drawings forming a part thereof, wherein an example of the invention is shown, and wherein.

DESCRIPTION OF A PREFERRED EMBODIMENT

Figure 1:
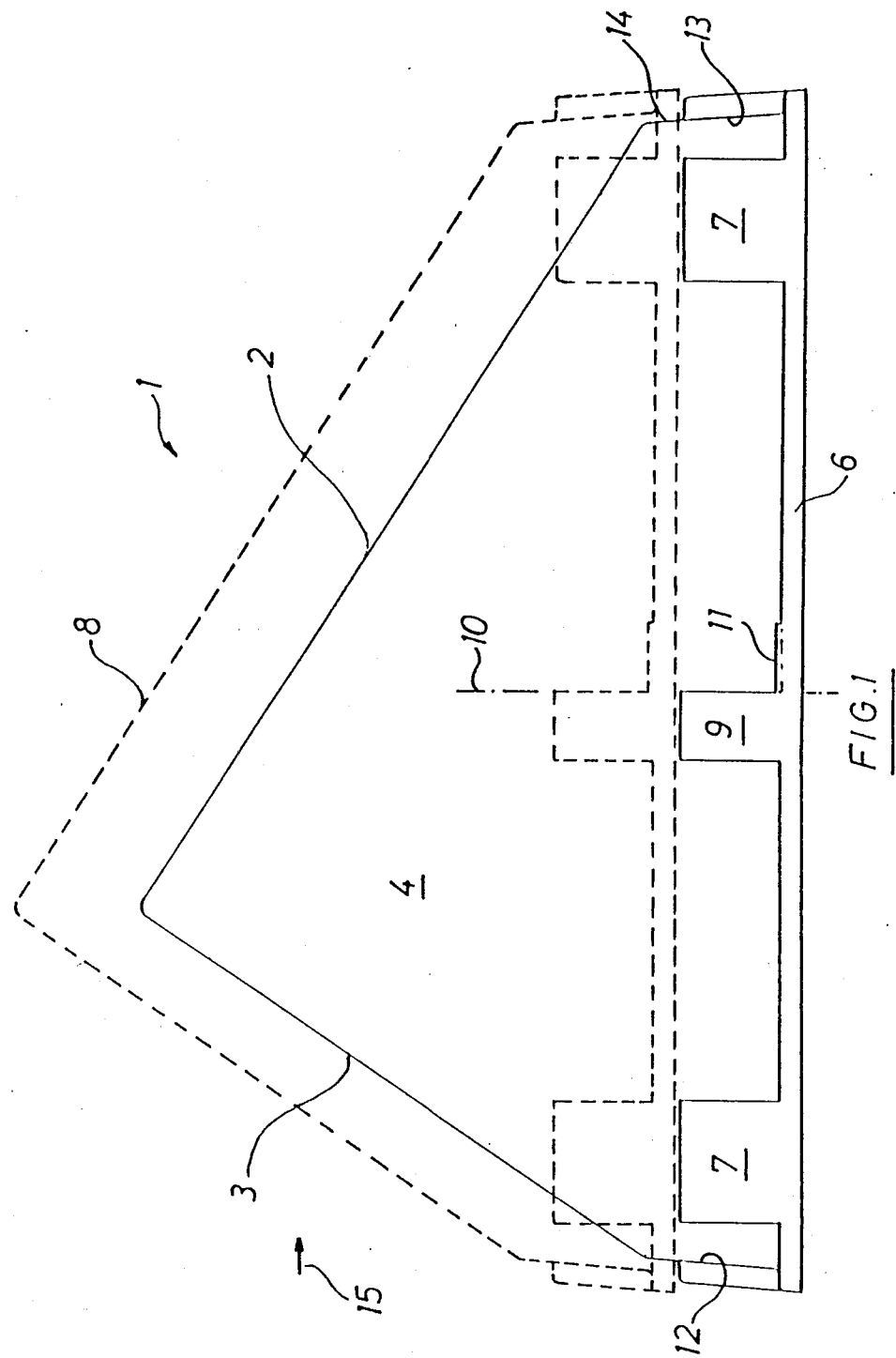
FIG. 1 is a side elevation of a housing element and, drawn in broken lines, of a second, stacked housing element.
Figure 2:
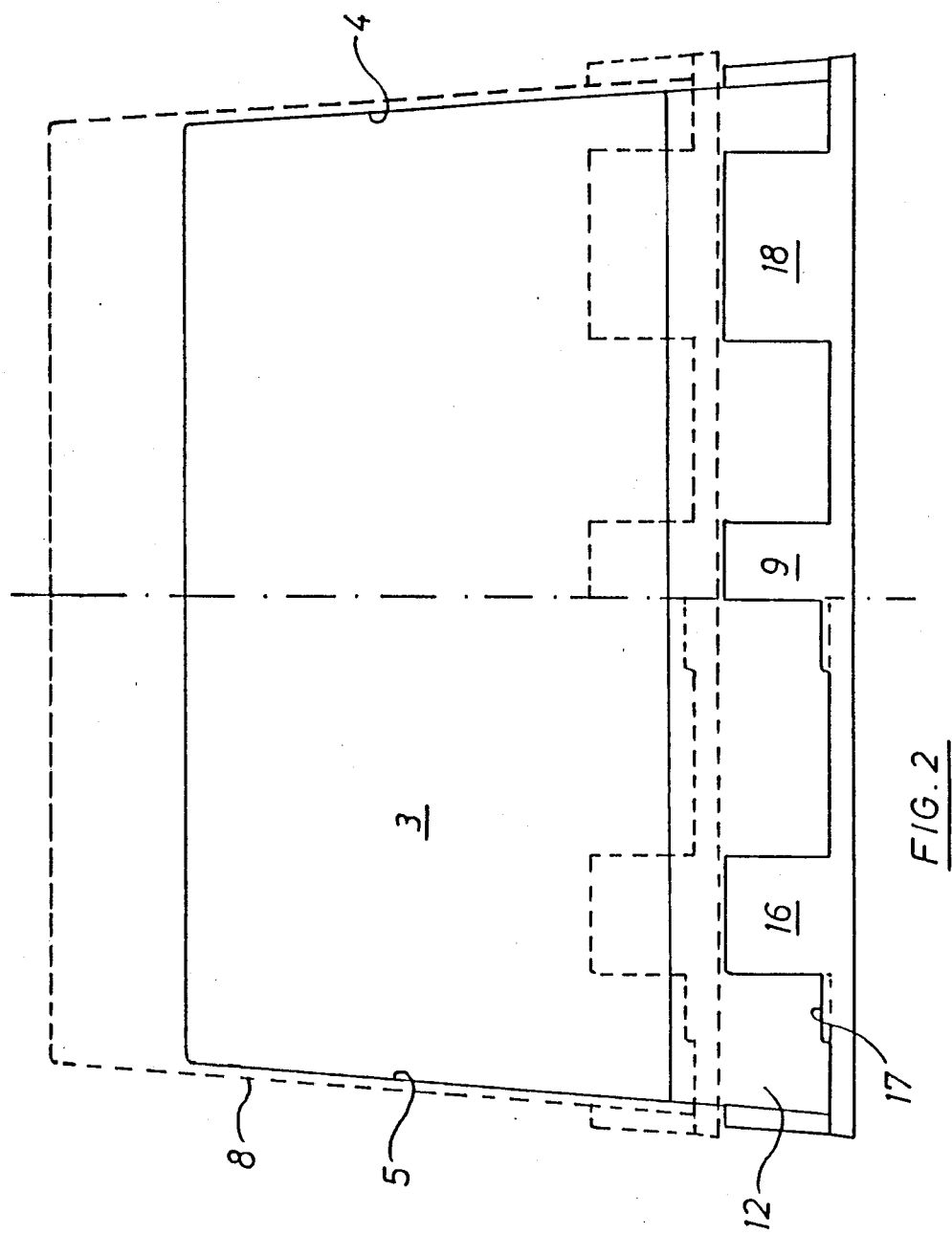
FIG. 2 is another side elevation of the arrangement according to FIG. 1.

A roof-shaped or three-cornered prism-shaped housing element, designated generally as 1, has two roof surfaces 2, 3 constituting the central surfaces of the completely assembled housing is shown in FIG. 1, with a forward lateral surface 4 and a rear lateral surface 5 (see FIG. 2). The roof surface 2 is longer than the roof surface 3 so that an unequal triangular form results. On the lower side an all-around, slightly projecting, molded-on juxtaposition rim 6 can be seen, at which wall reinforcements in the thickness of the projecting juxtaposition rim begin. The wall reinforcements 7 are blocks of material with an upper edge that is parallel to the juxtaposition rim 6, so the blocks of material serve as supports for an additional stacked housing element 8 (drawn in broken lines).

The wall reinforcements 7 are preferably designed so that hinges can be attached. The wall reinforcement 9, at the left of center line 10, is located next to a hooking catch 11 on the right of center line 10. When two housing elements are juxtaposed (see FIG. 4) each wall reinforcement 9 for the attachment of a quick-release lock faces a hooking catch so that this design is well suited for the attachment of quick-release locks.

The roof surfaces 2, 3 curve towards the juxtaposition rim 6 into the band-like wall segments 12, 13, whereby said band-like wall segments 12, 13 stand with slightly conical pitch on the juxtaposition surface constituted by the juxtaposition rim 6. The band-like wall segments 12, 13 are somewhat higher than the wall reinforcements 7, 9, so that a projecting end 14 remains.

FIG. 2 is a view along arrow 15 of FIG. 1. It shows the band-like wall segment 12 on which wall reinforcements are also attached to serve as stacking support points and to receive hardware can be recognized. The wall reinforcement at the approximate center is identical in type and function with the previously described wall reinforcement 9. A hooking catch 17 furthermore adjoins the wall reinforcement 16, whereby combined width of both is equal to that of wall reinforcement 18. When two identical housing elements are juxtaposed, either a hinge or a quick-release lock can be thus attached to the wall reinforcement 18.

The two lateral surfaces 4 and 5 are inclined at a slightly conical pitch towards the inside so that the other housing element 8 can be set on top of it to build a stack.

Figure 3:
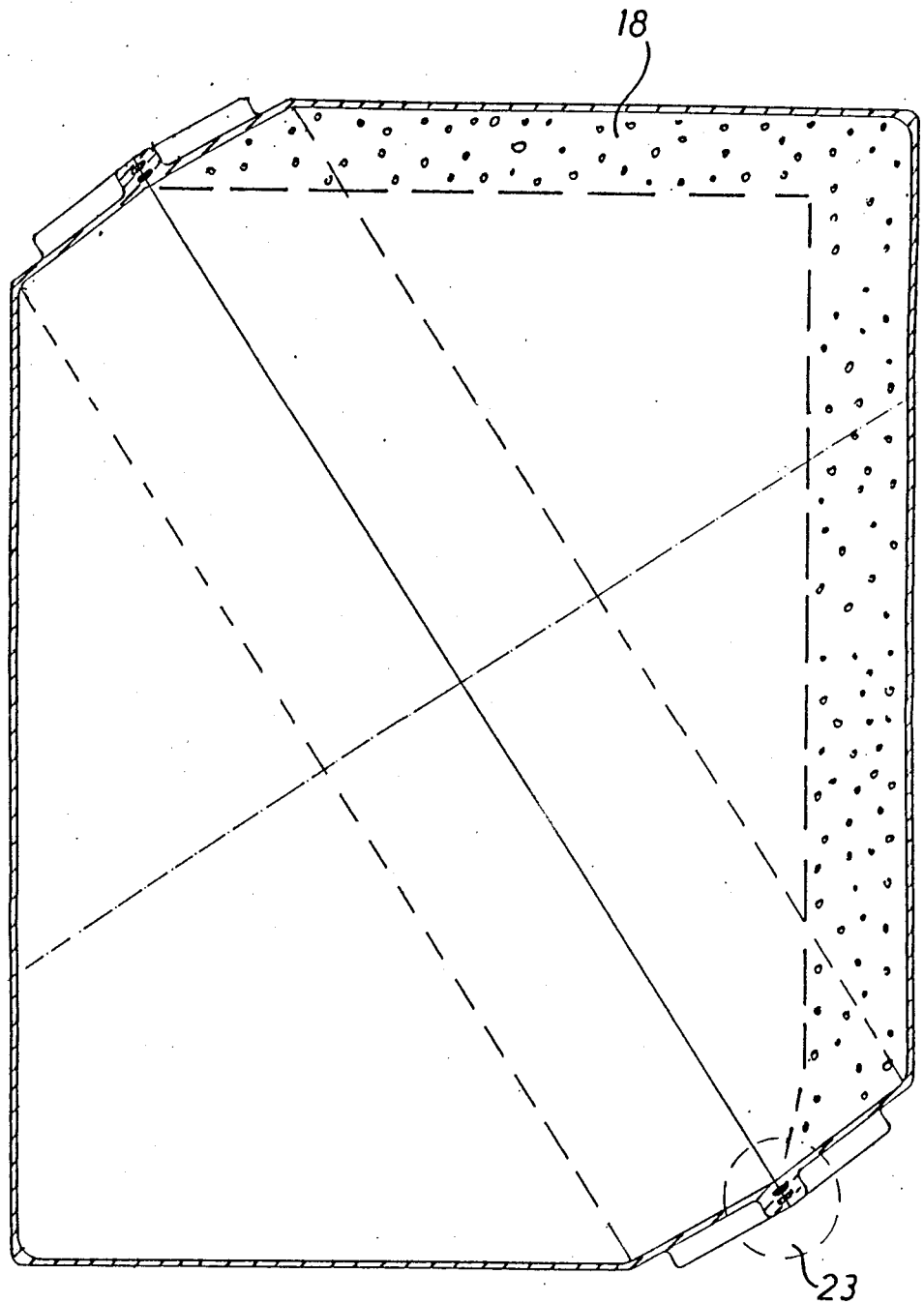
FIG. 3 is a cross section through two assembled housing elements, one of which is provided with thermal insulation.

FIG. 3 shows a cross-section through two housing elements assembled into one protective housing. An extruded foam layer of thermal insulation 18, an optional installation in the housing elements to obtain a thermally insulated model, is indicated in the right housing element.

Figure 4:
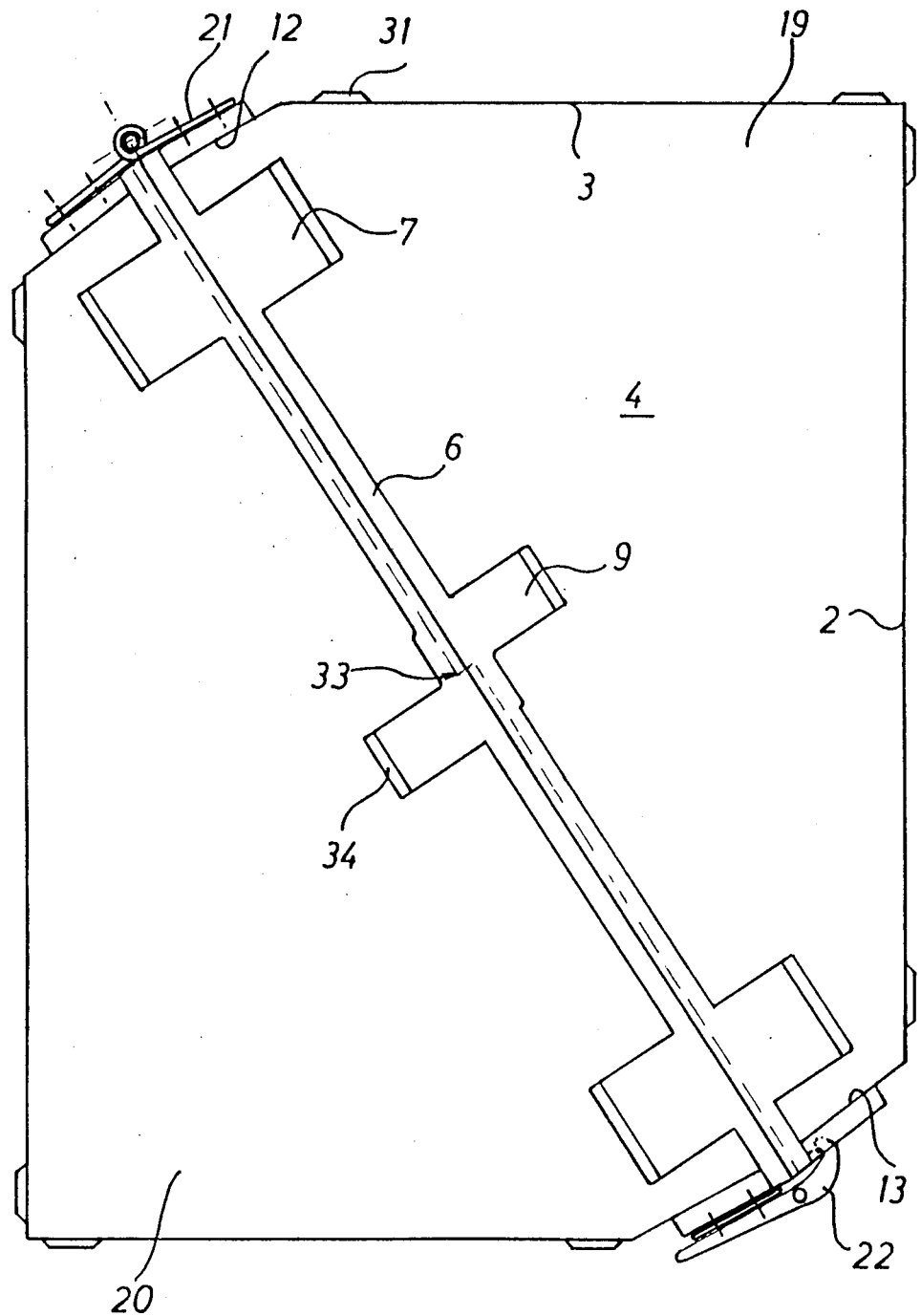
FIG. 4 is a side view of a complete protective housing with hinge and quick-release lock.

FIG. 4 is a side view of a complete protective housing 5 consisting of two housing elements 19 and 20 connected to each other via an upper hinge 21. Housing element 20 is stationary in this case while housing 19 can be opened by lifting. When closed, the two housing elements are held together by one or several quick-release locks 22 at the lower side.

It is obvious that the hinge 21 could also be attached at the bottom, or that two hinges could be attached on the sides with appropriate installation of one or more quick-release locks 22 in suitable opposition. In this way different opening directions and areas of application are made possible.

Figure 5:
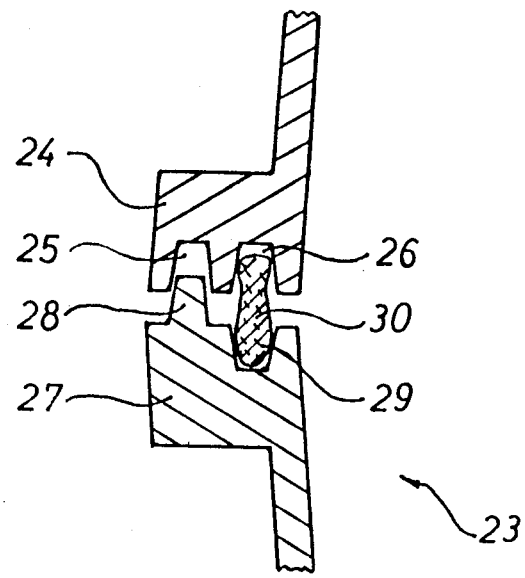
FIG. 5 is a cross section through a juxtaposition rim of two housing elements.

FIG. 5 is an enlarged cross-section through an area 23 near the edge (see FIG. 3). Two grooves 25, 26 running parallel to each other extend along the upper juxtaposition rim 24. A projection 28 to match the groove shape 25 as well as a second groove 29 are provided in the lower juxtaposition rim 27. An elastic sealing band 20 is inserted into groove 29. The drawing shows conditions when the protective housing is being closed, just before the two edges 24 and 27 come into contact with each other. It can be recognized that the projection 28 and the groove 25 constitute a positive-locking connection of relatively solid synthetic material and that the sealing strip 30 is pressed into the two grooves 26 and 29 for a tight fit. The profile is reversed from top to bottom at location 33 (see FIG. 4), so that two identical housing parts (19, 20) can be used. In FIG. 4, step-shaped formations 34 are indicated on the juxtaposition surfaces of the wall reinforcements 7 and 9, ensuring that any stacked housing half lies evenly on the stacking support points 7, 9 in spite of the projection 28.

Figure 6A:
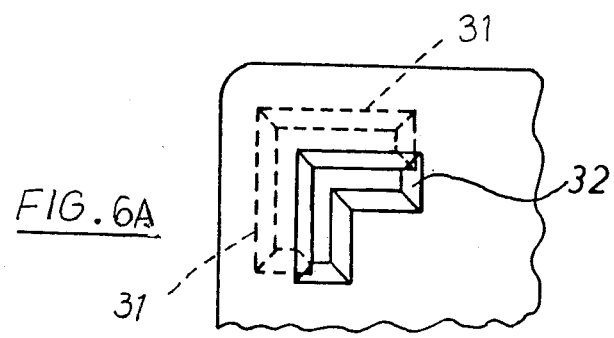
FIGS. 6 and 6A are top plan and side elevation views of the supporting feet near the corners of the central surfaces.
Figure 6:
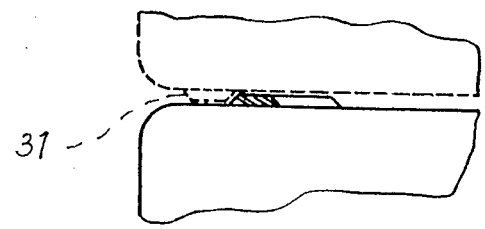

The position of small supporting feet 31 on the central surfaces is drawn in FIG. 4. These small feet 31 as shown in FIG. 6 and 6A are in the shape of elbows 32 having a nearly trapezoidal cross-section. In each pair on one surface the two elbows 32 are offset diagonally against each other towards the middle by the width of the elbow arm so that the elbows 32 are positioned in a relation to each other as shown in FIG. 6 and constitute antislipping devices in stacking. The small supporting feet 31 furthermore protect the surfaces from scratching and soiling.

In summary, it can be seen that a universally applicable, easily stacked, efficient and simple protective housing that is inexpensive to produce is made available by the instant invention.

What is claimed is:

1. A protective housing made of a synthetic material to hold measuring, control, monitoring and similar devices in repeated use under tightly sealed conditions, consisting of two housing elements having a plurality of sides, a juxtaposition rim carried around each of said sides, each said housing element including two generally parallel lateral surfaces and two central roof surfaces at an angle of approximately 90° to each other; and said two housing elements being joined together to form a protective housing generally in the shape of a parallelepiped in such manner that a juxtaposition surface is defined by the juxtaposition rim diagonally across the lateral surfaces of the housing, wherein the improvement comprises:

said central roof surfaces including two band-like wall segments inclined towards said juxtaposition rim;

each said band-like wall segment being disposed generally perpendicularly to the juxtaposition surface at a slightly conical pitch towards said central roof surfaces;

a plurality of wall reinforcement elements disposed adjacent said juxtaposition rim carried by the band-like wall segments generally at the same height, said wall reinforcement elements also being disposed on said lateral surfaces to serve as stacking support points and to receive hardware; and said lateral surfaces being inclined towards each other at a slightly conical pitch.

2. The housing of claim 1, wherein the two housing elements are identical.

3. The housing of claim 2, wherein the height of the wall reinforcement elements starting at said juxtaposition rim is less than the height of the band-like wall segment.

4. The housing of claim 1, wherein said hardware consists of hinges and quick-release locks.

5. The housing of claim 1 including at least one hooking catch carried by each housing element adjoining one of said wall reinforcement elements for the attachment of a lock, said hooking catch being opposite and aligned with a wall reinforcement element carried by an opposing housing element so that when the two housing elements are joined together each wall reinforcement is facing a hooking catch.

6. The housing of claim 1, wherein said juxtaposition rim includes:

a first zone wherein said juxtaposition rim is provided with two adjoining grooves, and a second zone wherein a projection corresponding generally to the configuration of said grooves is provided instead of a groove; and said first and second zones bordering on each other in the middle of said lateral surfaces.

7. The housing of claim 1, wherein an interior of the housing elements is insulated with a layer of extruded thermal insulation foam material having a given thickness.

8. The housing of claim 1 including:

at least two raised supports in the form of supporting feet carried by each of said central surfaces in identical manner and at the same distance from each other;

said supports being provided with juxtaposition surfaces in such manner that the two supports on a central surface constitute male and female elements from the point of view of their juxtaposition surface; and said supports engaging each other when the outer surface is rotated by 180° so that the support surfaces lie on top of each other in two degrees of freedom of a stacking plane and serve as antislipping devices.

9. The housing of claim 8 including:

four of said raised supports having an identical height attached adjacent the corners of the roof surfaces whereby their juxtaposition surfaces approximately constitute a rectangle in such a manner that each diagonally positioned support constitutes alternately an outer or inner juxtaposition surface with respect to the rectangle.

10. The housing of claim 8, wherein the configuration of the juxtaposition surfaces is straight.

11. The housing of claim 8, wherein the configuration of the juxtaposition surfaces is angled.

12. The housing of claim 8, wherein the configuration of the juxtaposition surfaces is corrugated.

13. The housing of claim 8, wherein the configuration of the juxtaposition surfaces is circular.

14. The housing of claim 8, wherein the configuration of the juxtaposition surfaces is U-shaped.

15. The housing of claim 8, wherein the configuration of the juxtaposition surfaces is T-shaped.

16. The housing of claim 8, wherein said supports include two othogonal legs in the shape of an elbow-shaped and the legs of the elbow define a rectangle and the elbow legs of the other two feet are diagonally offset against same by the width of an elbow leg.

17. The housing of claim 8, wherein the juxtaposition surfaces are made so as to stand at a pitch.

18. A protective housing made of a synthetic material to hold measuring, control, monitoring and similar devices in repeated use under tightly sealed conditions, consisting of two housing elements having a plurality of sides, a juxtaposition rim carried around each of said sides, each said housing element including two generally parallel lateral surfaces and two central roof surfaces at an angle of approximately 90° to each other; and said two housing elements being joined together to form a protective housing generally in the shape of a parallelepiped in such manner that a juxtaposition surface is defined by the juxtaposition rim diagonally across the lateral surfaces of the housing, wherein the improvement comprises:

said central roof surfaces being inclined downwardly where each terminates in a band-like wall segment;

each of said band-like wall segments being disposed at a slightly conical pitch towards said central roof surface;

a first plurality of wall reinforcement elements carried by said band-like wall elements adjacent said juxtaposition rim;

a second plurality of wall reinforcement elements carried by said lateral surfaces;

said wall reinforcement elements terminating at a height at which steps are defined to serve as stacking support points for supporting stacked housing elements one on top another; and said lateral surfaces being inclined towards each other at a slightly conical pitch facilitating stacking of said housing elements.

19. The housing of claim 18 including at least one hooking catch carried by each housing element adjoining one of said wall reinforcement elements for the attachment of a lock, said hooking catch being opposite and aligned with a wall reinforcement element carried by an opposing housing element so that when the two housing elements are joined together each wall reinforcement is facing a hooking catch.

* * * * *